United States Patent [19]

Amano et al.

[11] Patent Number: 5,178,465
[45] Date of Patent: Jan. 12, 1993

[54] OPTICAL FIBER LAYING STRUCTURE FOR ELECTRIC POWER CABLE LINE TROUBLE OCCURRENCE LOCATION DETECTING SYSTEM

[75] Inventors: Kazuo Amano; Shotaro Yoshida, both of Tokyo, Japan

[73] Assignee: Fujikura Ltd., Tokyo, Japan

[21] Appl. No.: 727,653

[22] Filed: Jul. 9, 1991

[30] Foreign Application Priority Data

Jul. 11, 1990 [JP] Japan .................................. 2-183078
Jul. 13, 1990 [JP] Japan .................................. 2-185969
Jul. 20, 1990 [JP] Japan .................................. 2-192444

[51] Int. Cl.⁵ ........................... G01J 5/10; G02B 6/10
[52] U.S. Cl. .................. 374/131; 250/227.29; 374/161
[58] Field of Search ............... 374/131, 161, 123, 104; 250/227.21, 227.29

[56] References Cited

U.S. PATENT DOCUMENTS

| | | | |
|---|---|---|---|
| 4,298,794 | 11/1981 | Snitzer et al. | 374/131 X |
| 4,432,599 | 2/1984 | McMahon | 250/227.21 X |
| 4,767,219 | 8/1988 | Bibby | 374/123 |

FOREIGN PATENT DOCUMENTS

| | | |
|---|---|---|
| 0165803 | 12/1985 | European Pat. Off. . |
| 58-056041 | 4/1983 | Japan . |
| 59-131177 | 7/1984 | Japan . |
| 60-207078 | 10/1985 | Japan . |
| 1-267428 | 10/1989 | Japan . |
| 2-140554 | 11/1984 | United Kingdom ........... 374/131 |
| 2170594 | 8/1986 | United Kingdom ........... 374/123 |
| 2211605 | 5/1989 | United Kingdom ........... 374/161 |

OTHER PUBLICATIONS

Patent Abstract of Japan, vol. 8, No. 259 (P-317)(1696), Nov. 28, 1984.
Patent Abstract of Japan, vol. 14, No. 27 (P-992), Jan. 19, 1990.
Patent Abstract of Japan, vol. 7, No. 142 (P-205)(1287), Jun. 22, 1983.
Patent Abstract of Japan, vol. 10, No. 68 (P-437)(2125), Mar. 18, 1986.

*Primary Examiner*—Daniel M. Yasich
*Attorney, Agent, or Firm*—Frishauf, Holtz, Goodman & Woodward

[57] ABSTRACT

In an optical fiber laying structure for an electric power cable line trouble occurrence location detecting system for detecting a trouble occurrence location by laying an optical fiber along an electric power cable line, the portion of the optical fiber laid along the cable of one of the two adjacent sections is superposed on the portion of the optical fiber laid along the cable of the other sections in an area in the vicinity of the boundary of the electric power cable line. Thus, if a temperature rise occurs due to a trouble such as a ground-fault in the boundary area, the temperature peak position, i.e., the trouble occurrence location can be detected by the two different optical fibers. Therefore, the trouble occurrence location in the boundary area can be accurately detected.

3 Claims, 12 Drawing Sheets

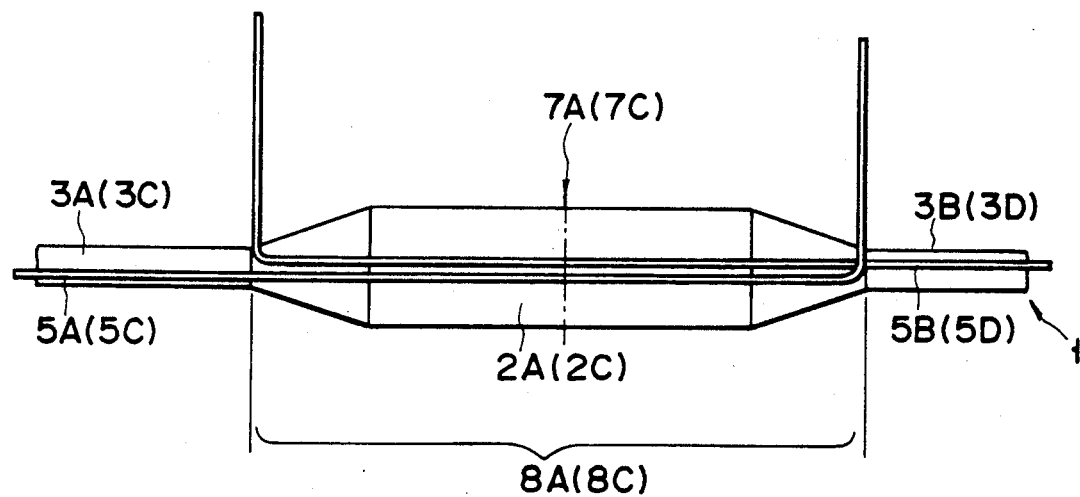
F I G. 3A
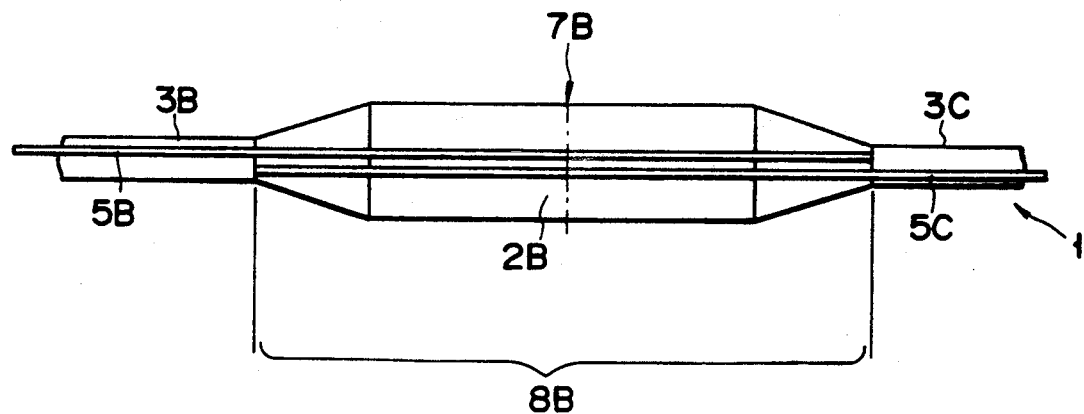
F I G. 3B

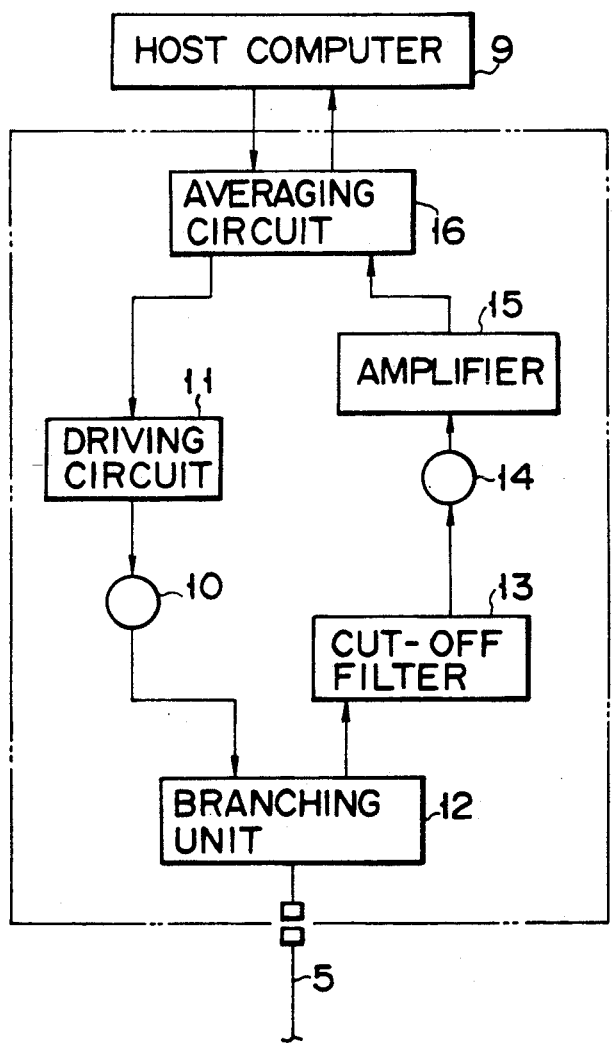
F I G. 8
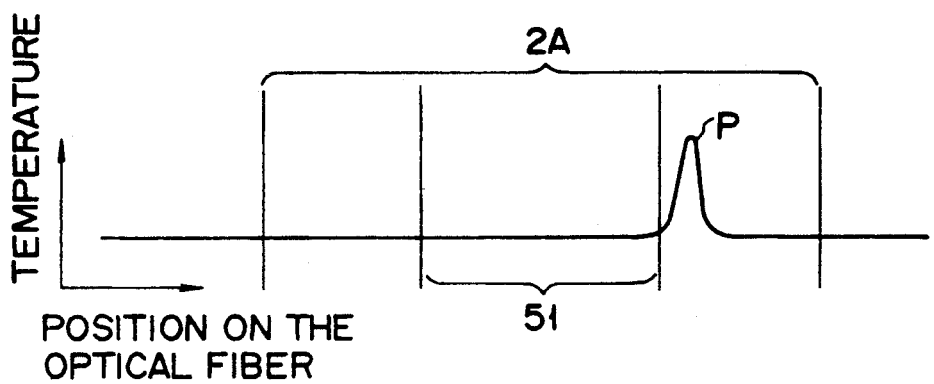
F I G. 9

OPTICAL FIBER LAYING STRUCTURE FOR ELECTRIC POWER CABLE LINE TROUBLE OCCURRENCE LOCATION DETECTING SYSTEM

BACKGROUND OF THE INVENTION

1. Field of the Invention

The present invention relates to a system for detecting a trouble occurrence location of an electric power cable line by using a distribution type temperature sensor and particularly a Raman backscattering optical fiber distribution type temperature sensor and, more particularly, to a structure in which an optical fiber of a temperature detector of a distribution type tempe-rature sensor is laid along an electric power cable line.

2. Description of the Related Art

Recently, as a system for detecting an occurrence location of a trouble such as a ground-fault in an electric power cable line (a short-circuit between an electric power cable line and the ground due to a breakdown of the insulator of the electric power cable line), a system using a Raman backscattering optical fiber distribution type temperature sensor has been developed as disclosed, for example, in Published Unexamined Japanese Patent Application No. 1-267428. More specifically, the Raman backscattering optical fiber distribution type temperature sensor can measure a temperature distribution in the longitudinal direction of an optical fiber of its temperature detector. When the optical fiber is laid along an electric power cable, a position on the electric power cable line where a temperature rises due to a trouble such as a ground-fault is detected to identify the trouble occurrence location.

A principle of measuring a temperature distribution by the above-described Raman backscattering optical fiber distribution type temperature sensor is as below. When a light is incident into an optical fiber, the light is scattered due to the small fluctuation of a refractive index in the optical fiber, absorption, or re-emission of a light by molecules, atoms of the optical fiber. There are as the scattered lights a Rayleigh scattering light having the same wavelength as the incident light and a Raman backscattering light having a different wavelength from the incident light. The latter Raman backscattering light is generated by the thermal vibration of molecules, atoms of the optical fiber, and its intensity depends largely upon its temperature. Therefore, when a pulse light having a specific wavelength (normally a laser pulse) is used as the incident light, the delay of a period of time until the light is returned as the scattered light and the intensity of the Raman backscattered light are detected, the temperatures of the positions of the optical fiber in the respective directions can be measured.

In order to lay an electric power cable line, it is common to sequentially connect electric power cables of a predetermined length (unit cable). Therefore, joint portions are always present along the electric power cable line. On the other hand, to perform maintenance of the electric power cable, it is rare to achieve maintenance and supervision of the entire electric power cable line of a long distance. It is common to divide the electric power cable line into a plurality of maintenance sections and to perform the maintenance of the respective maintenance sections by another sections or maintenance duty persons in charge. In this case, it is normal to place a boundary (maintenance boundary point) between the maintenance sections at the joint portion of the electric power cables.

Therefore, as a conventional method for laying a detecting optical fiber along an electric power cable line to actually apply an electric power cable line trouble occurrence location detecting system using the above-described optical fiber distribution type temperature sensor, a method as shown in FIG. 1 is employed.

In FIG. 1, an electric power cable line 1 has a plurality of unit cables 3A, 3B, 3C and 3D connected in series through joint portions 2A, 2B and 2C. The electric power cable line 1 is divided into a plurality of maintenance sections 4A to 4D at the intermediate positions of the joint portions 2A to 2C as boundaries at the respective unit cables 3A to 3D. Independent optical fibers 5A, 5B, 5C and 5D are respectively laid along the unit cables 3A, 3B, 3C and 3D at the unit cables 3A to 3D of the maintenance sections 4A to 4D. The ends of the optical fibers 5A to 5D are respectively connected to distribution type temperature sensor processing units 6A to 6D, which are, in turn, connected to a host computer 9.

In such a system as described above, a temperature peak position on the electric power cable line, i.e., an occurrence location of a trouble such as a ground-fault of the electric power cable line can be detected at each of the respective unit cables, i.e., the respective maintenance sections.

Since the sections or persons in charge of maintenance and supervision are different in the respective maintenance sections along the electric power cable line as described above, it is necessary to know where a trouble is generated in the maintenance sections, and it is particularly necessary to accurately detect where a trouble occurs in the adjacent maintenance sections in the vicinity of the boundary between the maintenance sections. On the other hand, the boundary between the maintenance sections is frequently disposed at the joint portion of the unit cables. The occurrence frequency of a trouble such as a ground-fault at the joint portions of the unit cables is remarkably higher than that at the normal portion of the electric power cable. Therefore, it is strongly desired to improve the detecting accuracy of the trouble occurrence location of the joint portion of the unit cables.

The Raman backscattering optical fiber distribution type temperature sensor can considerably accurately detect the temperature peak position due to its characteristics and an electric power cable line trouble occurrence location detecting system using the temperature sensor can considerably accurately detect the occurrence location of a trouble such as a ground-fault. However, it is not yet sufficient to accurately detect where the trouble occurrence location belongs to the section of which side in the vicinity of the boundary between the maintenance sections as described above, and it is not yet sufficient from the view of accurately detecting the trouble occurrence location at the joint portions of the unit cables having high trouble occurrence frequency.

SUMMARY OF THE INVENTION

Accordingly, it is an object of the present invention to provide a detecting optical fiber laying structure for an electric power cable line trouble occurrence location detecting system which can eliminate the above-described problems of the conventional system and can accurately detect the occurrence location of a trouble such as a ground-fault in the vicinity of a boundary position between maintenance sections of an electric power cable line or at a joint portion between unit cables.

In order to achieve the above-mentioned object, there is provided according to first aspect of the present invention an optical fiber laying structure for an electric power cable line trouble occurrence location detecting system for detecting a trouble occurrence location by laying an optical fiber of a temperature detector of a Raman backscattering optical fiber distribution type temperature sensor along an electric power cable line and detecting a temperature rising position of the power cable line, characterized in that the electric power cable line is divided into a plurality of sections, independent optical fibers are laid along the electric power cable line in the respective sections, and a portion of the optical fiber laid along one of the adjacent sections is superposed to be laid on a portion of the optical fiber laid along the other of the adjacent sections in the vicinity of each of the respective boundaries of the sections.

In order to achieve the above-mentioned object, there is provided according to second aspect of the present invention an optical fiber laying structure for an electric power cable line trouble occurrence location detecting system for detecting a trouble occurrence location by laying an optical fiber of a temperature detector of a Raman backscattering optical fiber distribution type temperature sensor along an electric power cable line and detecting a temperature rising position of the power cable line, characterized in that the electric power cable line comprises a plurality of unit cables connected in series, independent optical fibers are laid along said unit cables, and a portion of the optical fiber laid along one of the adjacent unit cables is superposed to be laid on a portion of the optical fiber laid along the other of the adjacent unit cables at a joint portion of the unit cables.

In the optical fiber laying structure according to the first aspect of the present invention, the portion of the detecting optical fiber laid along the cable of one of the two adjacent sections is superposed on the portion of the optical fiber laid along the cable of the other sections in an area in the vicinity of the boundary (hereinafter referred to as "a boundary area") of the electric power cable line. Therefore, if a temperature rise occurs due to a trouble such as a ground-fault in the boundary area, the temperature peak position, i.e., the trouble occurrence location can be detected by the two different optical fibers. As described above, when the trouble occurrence location is detected by the two different optical fibers, its detecting accuracy is remarkably enhanced as compared with the case that the accident is detected by only one optical fiber. For example, even if the temperature peak position obtained by one optical fiber is not always clearly present, it can be clarified by superposing the data from the two optical fibers, or even when the temperature peak position data obtained from the optical fiber is deviated from the true position, an error can be reduced by averaging the positional data obtained by the two optical fibers. Therefore, the trouble occurrence location in the boundary area can be accurately detected, and which of the sections the trouble occurrence location belongs to can be accurately determined.

In the optical fiber laying structure according to the second aspect of the present invention, the portion of the detecting optical fiber laid along the one of the adjacent unit cables is superposed to be laid on the portion of the detecting optical fiber laid along the other of the unit cables at each of the joint portions of the electric power cable line having a plurality of unit cables connected in series through the joint portions. Therefore, when a temperature rise occurs due to a trouble such as a ground-fault at the joint portion of the unit cables, the temperature peak position, i.e., the trouble occurrence location is detected by the two different optical fibers, thereby accurately detecting the trouble occurrence location in the joint portion.

In the actual electric power cable line, the joint portions of the unit cables frequently become the boundary between the maintenance sections as already described above. Therefore, in this case, the detection of the trouble occurrence location in the boundary area by the two optical fibers in the first aspect of the present invention becomes equivalent to the detection of the trouble occurrence location in the joint portion by the two optical fibers in the second aspect of the present invention. In other words, in this case, the occurrence location of a trouble such as a ground-fault can be accurately detected in the portion of the boundary area as well as the joint portion.

According to third aspect of the present invention, there is provided an optical fiber laying structure for an electric power cable line trouble occurrence location detecting system for detecting a trouble occurrence location by laying an optical fiber of a temperature detector of a Raman backscattering optical fiber distribution type temperature sensor along an electric power cable line and detecting a temperature rising position of the power cable line, characterized in that the electric power cable line is divided into a plurality of sections, and a surplus portion irrespective of the position on the electric power cable line in the long-itudinal direction of the line is formed at a portion of the optical fiber in the longitudinal direction of the optical fiber at least at one portion of the electric power cable line in the vicinity of the boundary of the sections of the electric power cable line.

According to fourth aspect of the present invention, there is provided an optical fiber laying structure for an electric power cable line trouble occurrence location detecting system for detecting a trouble occurrence location by laying an optical fiber of a temperature detector of a Raman backscattering optical fiber distribution type temperature sensor along an electric power cable line and detecting a temperature rising position of the power cable line, characterized in that the electric power cable line comprises a plurality of unit cables connected in series, and a surplus portion irrespective of the position (distance) of the electric power cable line in the longitudinal direction of the line is formed at least at a portion of the optical fiber in the longitudinal direction of the optical fiber at least at one portion of the electric power cable line in the vicinity of each of the joint portions of the unit cables.

In the optical fiber laying structure of the third aspect of the present invention, the portion of the detecting optical fiber in the longitudinal direction is formed as the surplus portion irrespective of the position of the electric power cable line in the longitudinal direction at least at one portion of the region in the vicinity of the boundary of the electric power cable line. In other words, in the electric power cable line trouble occurrence location detecting system of this type, the optical fiber is laid along the electric power cable line to correspond the longitudinal positions of the optical fiber to the longitudinal posi-tions (distance) of the electric power cable line to provide the temperature peak position to be detected by the optical fiber in relation to the position (distance) of the electric power cable line, thereby detecting the temperature peak position, i.e., the trouble occurrence location of the electric power cable line. In the case of the fourth aspect of the present invention, the surplus portion is provided at the optical fiber at least at one portion in the vicinity of the boundary area to eliminate the correspondence of the portion to the longitudinal position of the electric power cable line. Since the surplus portion is irrespective of the temperature peak position of the electric power cable line, the apparent distance detecting accuracy in the vicinity of the boundary is enhanced due to the presence of the surplus portion.

More specifically, when a temperature rise occurs due to a trouble such as a ground-fault in the vicinity of the boundary of the electric power cable line, if the surplus portion is not formed at the optical fiber as described above, it might not clearly determine which of the sides at the boundary as a boundary the temperature peak position, i.e., the trouble occurrence location occurs, but when the surplus portion as described above is formed, for example, at the optical fiber just at the position corresponding to the boundary, the detecting accuracy is improved in the amount corresponding to the length of the surplus portion to clearly determine which of the sides with respect to the boundary the temperature peak position belongs to.

In the optical fiber laying structure of the fourth aspect of the present invention, the surplus portion irrespective of the position of the electric power cable line in the longitudinal direction of the line is formed at least at the portion in the vicinity of each of the joint portions of the electric power cable line having a plurality of unit cables connected in series through the joint portions of the unit cables. Therefore, the apparent distance detecting accuracy in the vicinity of the joint portion is enhanced due to the presence of the surplus portion.

More specifically, when the surplus portion of the optical fiber is formed, for example, at the central position of the joint portion, which of the sides at the central position of the joint portion as a boundary the temperature peak position, i.e., the trouble occurrence location belongs to can be clearly determined. When the surplus portions of the optical fibers are formed, for example, at both end positions of the joint portion, whether the temperature peak position, i.e., the trouble occurrence location is located in the joint portion or outside the joint portion can be clearly determined.

In the actual electric power cable line, the joint portions of the unit cables frequently become the boundary between the maintenance sections as already described above. Therefore, in this case, the formation of the surplus portion of the optical fiber at least at one portion of the electric power cable line in the vicinity of the boundary in the first aspect of the present invention is equivalent to the formation of the surplus portion of the optical fiber at least at one portion of the electric power cable line in the vicinity of the joint portion in the second aspect of the present invention. In other words, in this case, the occurrence location of a trouble such as a ground-fault of the portion in the vicinity of the boundary as well as the joint portion can be accurately detected.

According to fifth aspect of the present invention, there is provided an optical fiber laying structure for an electric power cable line trouble occurrence location detecting system for detecting a trouble occurrence location by laying an optical fiber of a temperature detector of a Raman backscattering optical fiber distribution type temperature sensor along an electric power cable line and detecting a temperature rising position of the power cable line, characterized in that the electric power cable line is divided into a plurality of sections, and different two or more portions of the same optical fiber in the longitudinal direction are superposed to be laid in the vicinity of the boundary of the sections.

According to sixth aspect of the present invention, there is provided an optical fiber laying structure for an electric power cable line trouble occurrence location detecting system for detecting a trouble occurrence location by laying an optical fiber of a temperature detector of a Raman backscattering optical fiber distribution type temperature sensor along an electric power cable line and detecting a temperature rising position of the power cable line, characterized in that the electric power cable line comprises a plurality of unit cables connected in series, and different two or more portions of the same optical fiber in the longitudinal direction are superposed to be laid in the joint portion of each of the unit cables.

In the optical fiber laying structure according to the fifth aspect of the present invention, the different two or more portions of the same detecting optical fiber are superposed to be laid in an are in the vicinity of the boundary of the electric power cable line. Therefore, if a temperature rise occurs due to a trouble such as a ground-fault in the boundary area, the temperature peak position, i.e., the trouble occurrence location can be detected by the two or more portions of the same optical fiber. As described above, when the trouble occurrence location is detected by the two or more portions of the same optical fiber, its detecting accuracy is remarkably enhanced as compared with the case that the trouble is detected by only one portion of the optical fiber. For example, even if the temperature peak position in the boundary area obtained by the optical fiber is not always clearly present, it can be clarified by superposing the data from the two or more portions of the optical fibers corresponding to the boundary area, or even when the temperature peak position data obtained from the optical fiber is deviated from the true position, an error can be reduced by averaging the positional data obtained by the two or more portions of the optical fiber. Therefore, the trouble occurrence location in the boundary area can be accurately detected, and which of the sections the trouble occurrence location belongs to can be accurately determined.

In the optical fiber laying structure according to the sixth aspect of the present invention, the two or more portions of the same detecting optical fiber in the longitudinal direction are superposed to be laid at each of the joint portions of the electric power cable line having a plurality of unit cables connected in series through the joint portions. Therefore, when a temperature rise occurs due to a trouble such as a ground-fault at the joint portion of the unit cables, the temperature peak position, i.e., the trouble occurrence location is detected by the different two or more portions of the same optical fiber, thereby accurately detecting the trouble occurrence location in the joint portion in the same manner as described above.

In the actual electric power cable line, the detection of the trouble occurrence location in the boundary area by the two or more portions of the same optical fiber in the fifth aspect of the present invention is equivalent to the detection of the trouble occurrence location in the joint portion by the two or more portions of the same optical fiber in the sixth aspect of the present invention. In other words, in this case, the occurrence location of a trouble such as a ground-fault can be accurately detected in the portion of the boundary region as well as the joint portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are respectively front views showing an essential portion of the embodiment in FIG. 2;

FIG. 8 is a block diagram showing an arrangement of a processing unit used for the electric power cable line trouble occurrence location detecting system of FIG. 8;

FIG. 9 is a diagram showing the relationship between the longitudinal position of the optical fiber of the arrangement of FIG. 7 and the detecting temperature;

FIG. 10 is a schematic view showing other embodiment of the detecting optical fiber laying structure of FIG. 7;

FIG. 11 is a diagram showing the relationship between the longitudinal position of the optical fiber of the arrangement of FIG. 10 and the detecting temperature;

FIG. 12 is a schematic view showing other embodiment of the detecting optical fiber laying structure of FIG. 7;

DETAILED DESCRIPTION OF THE PREFERRED EMBODIMENTS

Figure 2:
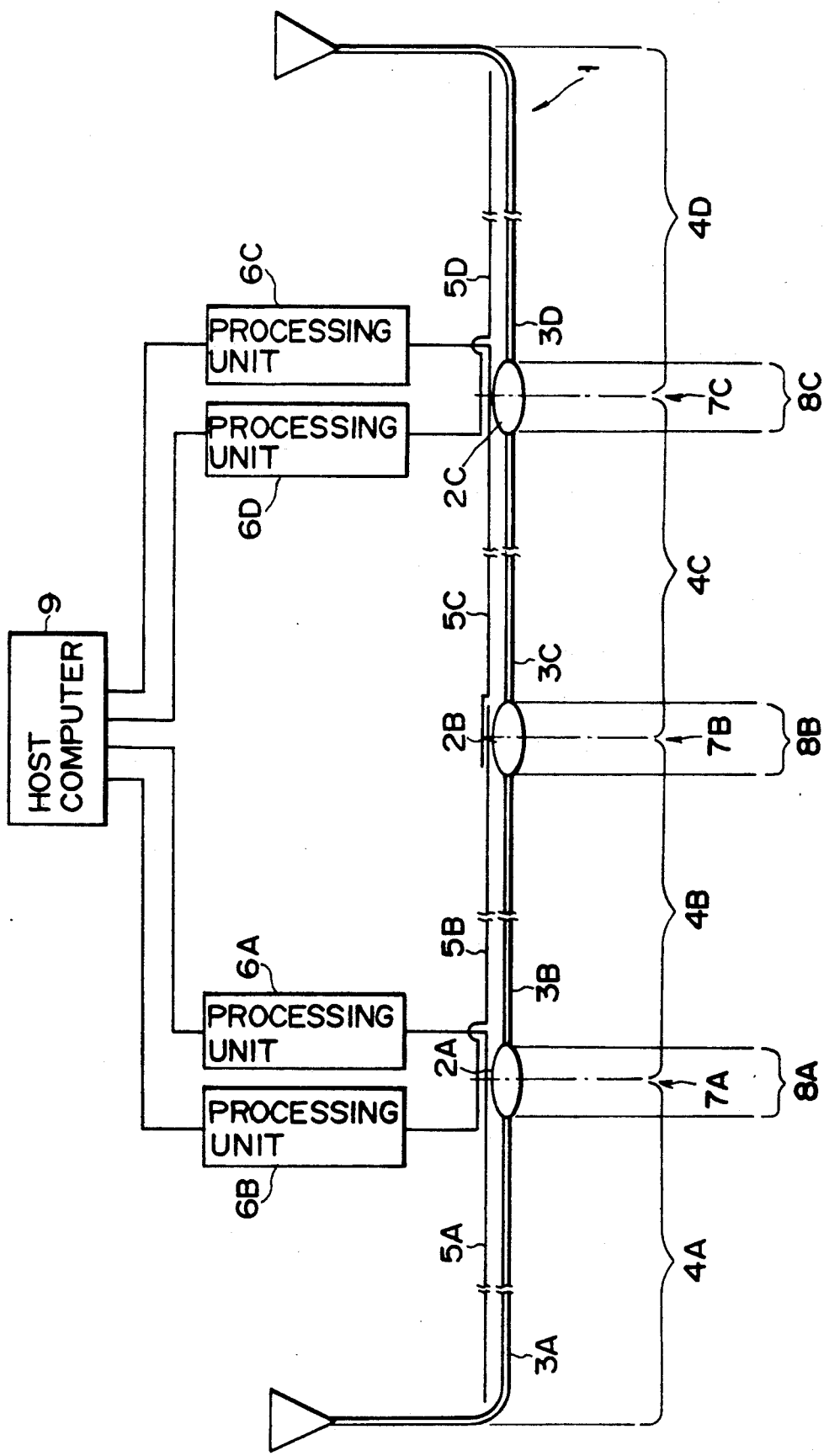
FIG. 2 is a schematic view showing an entire arrangement of an embodiment of a detecting optical fiber laying structure for an electric power cable line trouble occurrence location detecting system according to the present invention.

FIG. 2 schematically shows an entire arrangement of an embodiment according to first and second aspects of the present invention.

Figure 1:
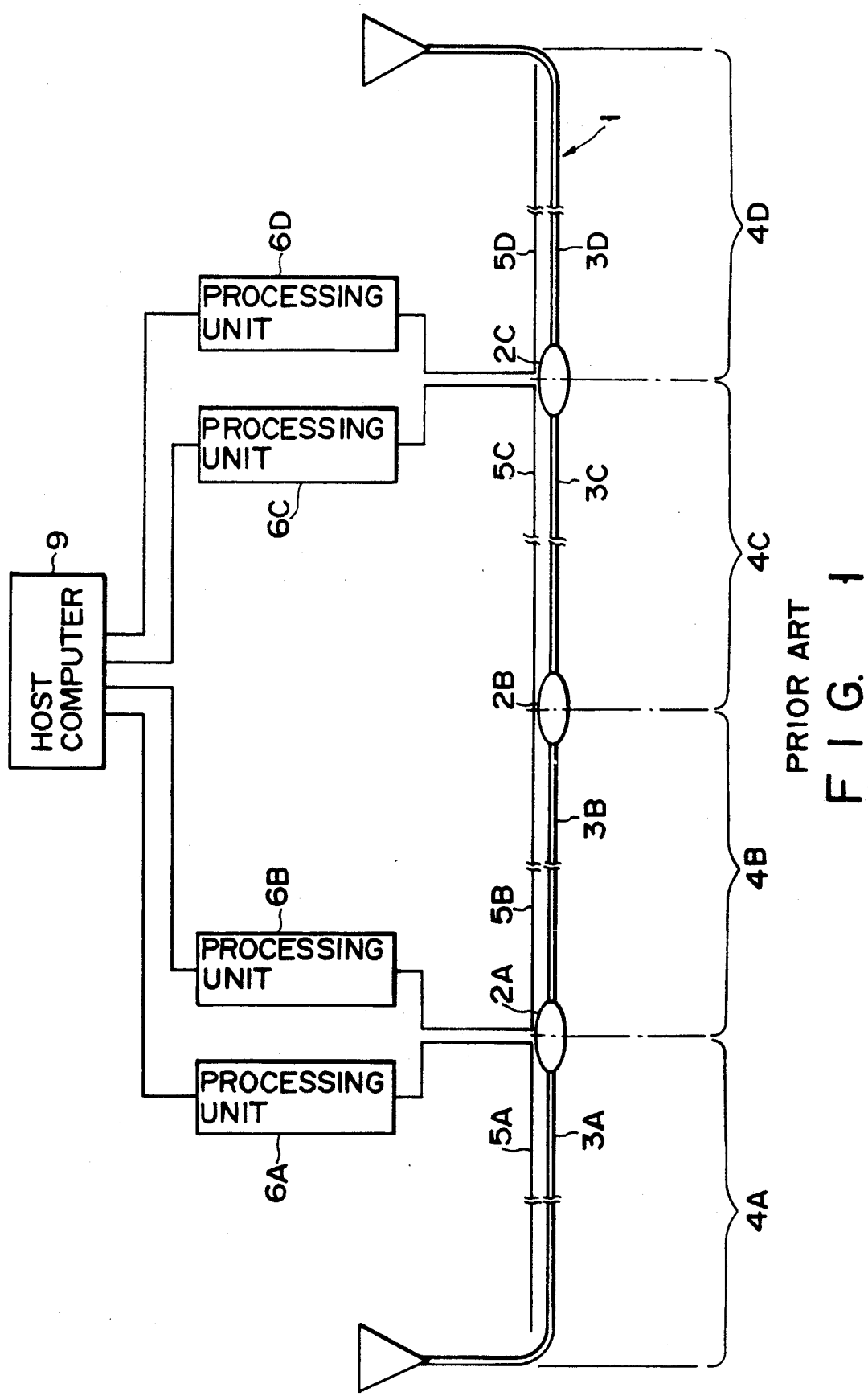
FIG. 1 is a schematic view showing an example of a detecting optical fiber laying structure for a conventional electric power cable trouble occurrence location detecting system.

In FIG. 2, an electric power cable line 1 has, similarly to the prior art shown in FIG. 1, a plurality of unit cables 3A to 3D connected in series through joint portions 2A, 2B and 2C. The electric power cable line 1 is divided into a plurality of maintenance sections 4A to 4D at the centers of the joint portions 2A to 2C as section boundaries 7A to 7C. Therefore, the joint portions 2A to 2C respectively become boundary areas 8A to 8C of the sections. Optical fibers 5A to 5D are respectively laid along the unit cables 3A to 3D of the maintenance sections 4A to 4D at the unit cables 3A to 3D. The optical fibers 5A to 5D are respectively connected to distribution type temperature sensor measuring units 6A to 6D, which are, in turn, connected to a host computer 9. The optical fibers 5A to 5D are respectively laid at the portions, i.e., end portions or the initial laying portions to be laid along the electric power cable line 1 along the joint portions 2A to 2C, i.e., the boundary areas 8A to 8C. Thus, two optical fibers are respectively laid along the joint portions 2A to 2C, i.e., the boundary areas 8A to 8C. More specifically, the initial laying portions of both the optical fibers 5A and 5B or 5C and 5D to the electric power cable line 1 are superposed to be laid at the joint portion 2A (i.e., the section boundary area 8A) or the joint portion 2C (i.e., the section boundary area 8C) along the electric power cable line 1 as shown in FIG. 3A, and the ends of both the optical fibers 5B and 5C are superposed to be laid at the joint portion 2B (i.e., the section boundary area 8B) as shown in FIG. 3B.

Figure 4:
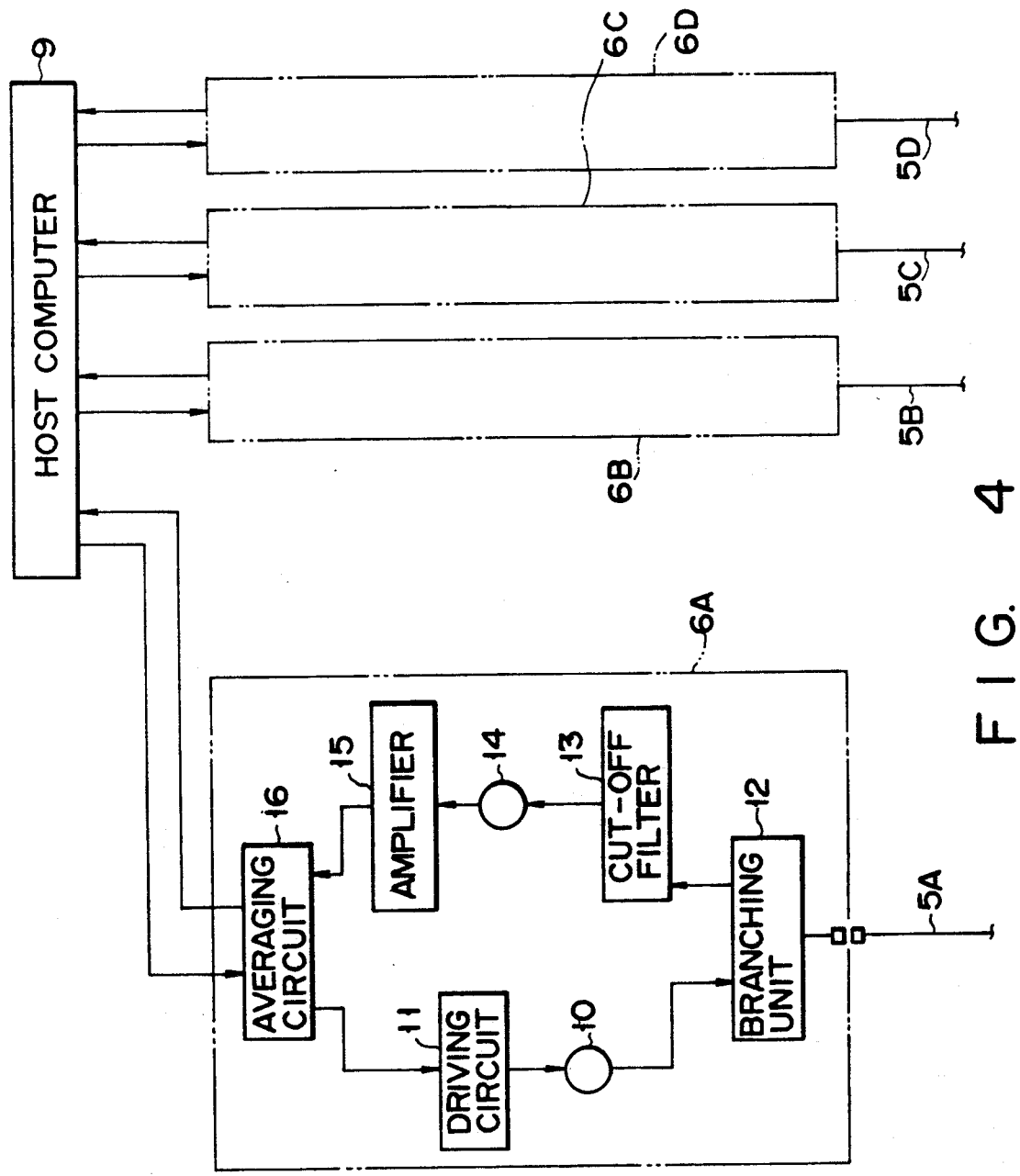
FIG. 4 is a block diagram showing an arrangement of a processing unit used for the electric power cable line trouble occurrence location detecting system of FIG. 2.

Arrangements of distribution type temperature sensor processing units 6A to 6D respectively connected to the optical fibers 5A to 5D may be the same as ordinary ones, and are normally formed as shown in FIGS. 3A and 3B. More specifically, the processing units 6A to 6D emit laser pulse lights as incident lights to the optical fibers 5A to 5D, isolate Raman backscattering lights to be returned from the optical fibers, photodetect the Raman backscattering lights, amplify and average the same lights. As shown in FIG. 4, each processing unit comprises a laser light source 10 for oscillating a laser light pulse as an incident light to the optical fiber, a driving circuit 11 for driving the laser light source 10, a branching unit 12 for separating a Raman backscattering light from reflected scattering light to be returned from each of the optical fibers 5A to 5D, a cut-off filter 13 for cutting off the light component except the Raman light in the Raman backscattering light, a photodetector 14 for converting the Raman backscattering light to be output from the cut-off filter 13 into an electric signal, an amplifier 15 for amplifying the electric signal from the photodetector 14, and an averaging circuit 16 for improving S/N ratio of the electric signal. The output signals from the respective processing units 6A to 6D (output signals from the averaging circuits 16) are applied to the host computer 9, and a control signal from the host computer 9 is applied to each of the processing units 6. The host computer 9 calculates the output signals from the processing units 6A to 6D to obtain a temperature distribution in the longitudinal direction of the optical fibers 5A to 5D and to further obtain the temperature peak position, i.e., the occurrence location of a trouble such as a ground-fault. At this time, as described above, since the portions of the two optical fibers are superposed to be laid along the joint portions 2A to 2C (the section boundary areas 8A to 8C), the host computer 9 calculates the data obtained by the signals from the portions of the two optical fibers and can accurately obtain the temperature peak position, i.e., the occurrence location of a trouble such as a ground-fault.

Figure 5:
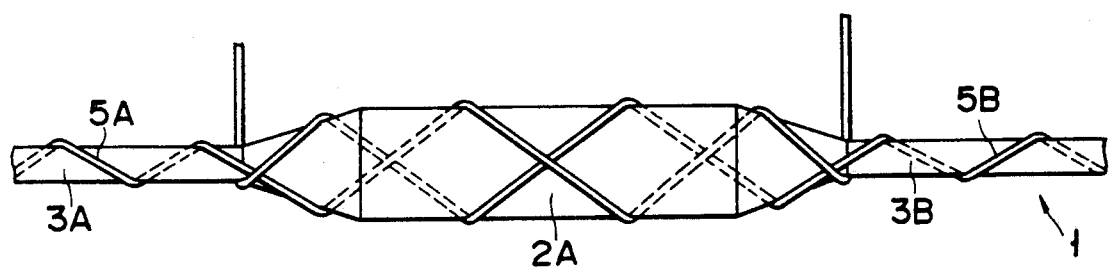
FIGS. 5 and 6 are front views respectively showing essential portions of other embodiments of the detecting optical fiber laying structure of FIG. 2.
Figure 6:
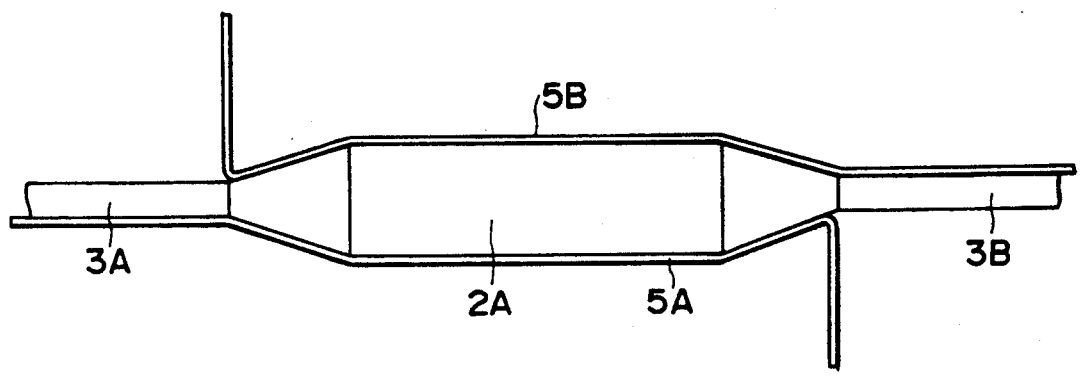

The concrete arrangement in which the optical fibers 5A to 5D are respectively laid along the unit cables 3A to 3D and the joint portions 2A to 2C are optional. For example, as shown in FIGS. 3A and 3B, the optical fibers may be supported by suitable supporting means (not shown) to be linearly laid along the longitu-dinal direction of the unit cables and the joint portions or, as shown in FIG. 5, the optical fibers may be spirally wound on the electric power cable line 1. The fact that the portions of the two optical fibers are superposed to be laid along the joint portions 2A to 2C is not limited to the case that two optical fibers are superposed or arranged adjacently at the same side of the joint portions 2A to 2C. For example, as shown in FIG. 6, it may include the case that the portions of the two optical fibers are arranged on the opposed surfaces of the joint portions 2A to 2C.

Further, in the embodiment shown in FIGS. 2 and 3A, 3B described above, the boundaries 7A to 7C are disposed at the centers of the joint portions 2A to 2C. However, the present invention is not limited to the particular embodiment. For example, the boundaries 7A to 7C may be disposed at the ends of the joint portions 2A to 2C. In this case, the boundary areas 8A to 8C may be normally determined, similarly to the embodiment described above, to be formed of the areas made of joint portions 2A to 2C. Alternatively, areas including the portions at both sides of the boundaries 7A to 7C of the ends of the joint portions 2A to 2C, i.e., areas including both the joint portions and the ends of the unit cables connected to the joint portions may be determined as section areas.

In addition, the boundaries 7A to 7C may be set at individually independent positions from the joint portions 2A to 2C. In this case, since the boundary areas 8A to 8C are disposed at positions separate from the joint portions 2A to 2C, this embodiment is different from the first and second aspects of the present invention.

According to the optical fiber laying structure for the electric power cable line trouble occurrence location detecting system of the first aspect of the present invention, the portions of the two detecting optical fibers of the separate measuring units are superposed to be laid along the areas in the vicinity of the boundary of the electric power cable line. Therefore, the temperature peak position, i.e., the occurrence location of a trouble such as a ground-fault is detected by the two optical fibers of the separate measuring units in the areas, hence the position can be accurately detected, and thus at which of the adjacent sections the trouble occurs can be easily determined.

According to the detecting optical fiber laying structure for the electric power cable line trouble occurrence location detecting system of the second aspect of the present invention, the two optical portions of the separate measuring units are superposed to be laid along the joint portions of the unit cables of the electric power cable line. Therefore, the temperature peak position, i.e., the occurrence location of a trouble such as a ground-fault is detected by the two separate optical fibers at the joint portions, and hence the trouble occurrence signal of the joint portion having a high occurrence frequency of a trouble such as the ground-fault can be accurately detected.

Figure 7:
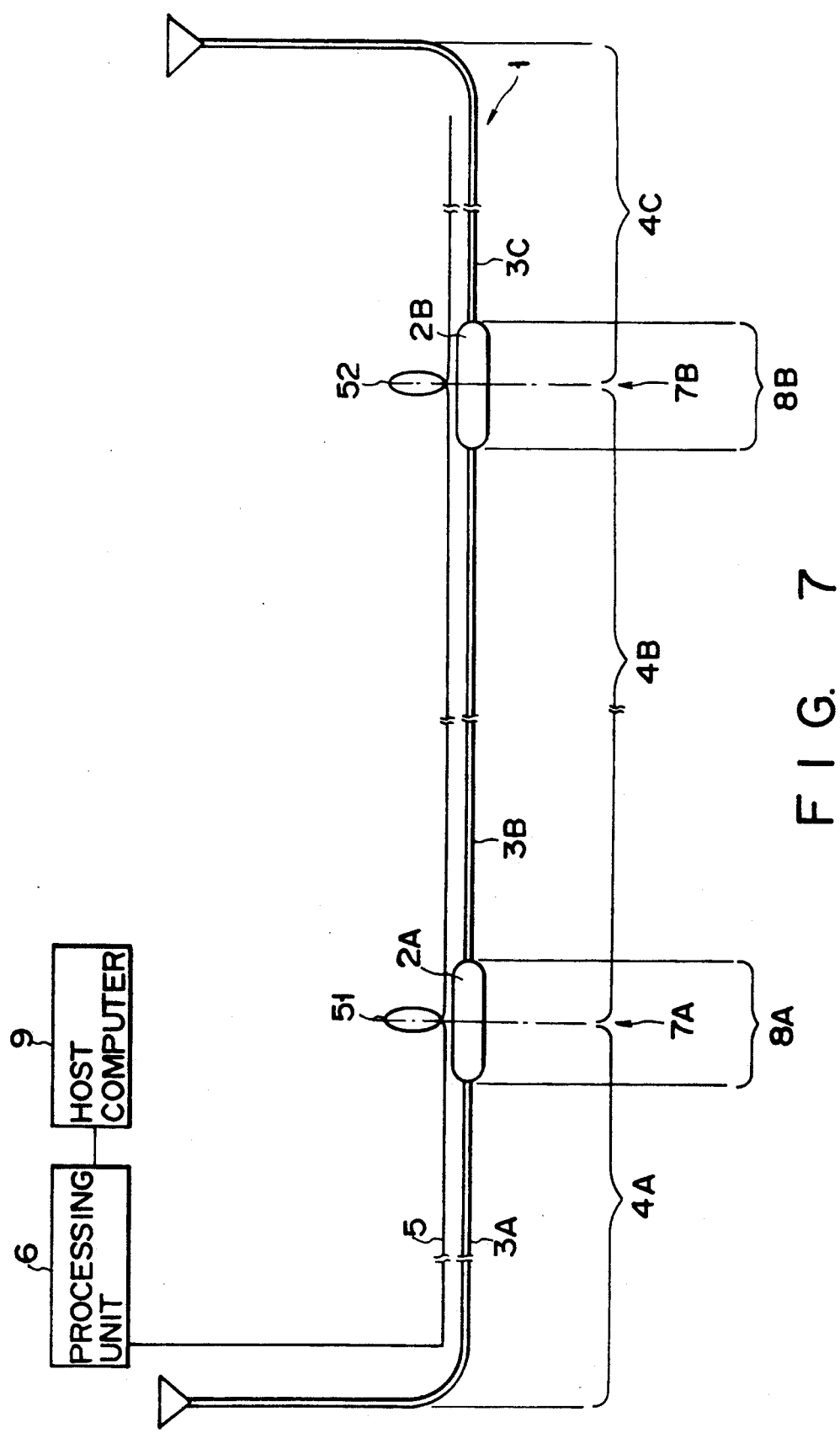
FIG. 7 is a schematic view showing an entire arrangement of other embodiment of a detecting optical fiber laying structure for an electric power cable line trouble occurrence location detecting system according to the present invention.

FIG. 7 schematically shows an entire arrangement of an embodiment according to third and second aspects of the present invention.

In FIG. 7, an electric power cable line 1 has a plurality of unit cables 3A to 3C connected in series through joint portions 2A and 2B. The electric power cable line 1 is divided into a plurality of maintenance sections 4A to 4C at the centers of the joint portions 2A and 2B as boundaries 7A and 7B. Therefore, the joint portions 2A and 2B respectively become boundary areas 8A to 8B. An optical fiber 5 is laid along the entire electric power cable line 1. The optical fiber 5 is connected to a distribution type temperature sensor processing unit 6, which is, in turn, connected to a host computer 9. The optical fiber 5 is wound at the portion of the longitudinal direction in a loop shape at the central position of the joint portion 2A (i.e., the boundary area 8A), i.e., the boundary 7A so that the portion is formed as a surplus portion 51. The optical fiber 5 is similarly wound at the portion of the longitudinal direction in a loop shape at the central position of the joint portion 2B (i.e., the boundary area 8B), i.e., the boundary 7B so that the portion is formed as a surplus portion 52. The surplus portions 51 and 52 wound in the loop shape are all isolated from the joint portions 2A and 2B.

An arrangement of distribution type temperature sensor processing unit 6 connected to the optical fiber 5 may be the same as ordinary one, and is normally formed as shown in FIG. 8. More specifically, the processing unit 6 emits a laser pulse light as an incident light to the optical fiber 5, isolates a Raman backscattering light to be returned from the optical fiber, photodetects the Raman backscattering light, amplifies and averages the same light. As shown in FIG. 8, the processing unit comprises a laser light source 10 for oscillating a laser light pulse as an incident light to the optical fiber, a driving circuit 11 for driving the laser light source 10, a branching filter 12 for separating a Raman backscattering light from reflected scattering light to be returned from the optical fiber 5, a cut-off filter 13 for cutting off the light component except the Raman light in the Raman backscattering light, a photodetector 14 for converting the Raman backscattering light to be output from the cut-off filter 13 into an electric signal, an amplifier 15 for amplifying the electric signal from the photodetector 14, and an averaging circuit 16 for improving S/N ratio of the electric signal. The output signal from the processing unit 6 (the output signal from the averaging circuit 16) is applied to the host computer 9, and a control signal from the host computer 9 is applied to the processing unit 6. The host computer 9 calculates the output signal from the processing unit 6 to obtain a temperature distribution in the longitudinal direction of the optical fiber 5 and to further obtain the temperature peak position, i.e., the occurrence location of a trouble such as a ground-fault. At this time, as described above, since the surplus portions 51, 52 are formed at the portions of the optical fiber in the longitudinal direction at the central positions of the joint portions 2A and 2B (the boundary areas 8A and 8B), i.e., the boundaries 7A and 7B, the computer 9 stores in advance the data of the lengths of the surplus portions 51 and 52, calculates the data obtained by the signal from the optical fiber to obtain the temperature peak position, i.e., the occurrence location of a trouble such as a ground-fault, and can accurately detect at which of the sides to the centers of the joint portions 2A and 2B (boundaries 7A and 7B) the position belongs to. For example, if a temperature peak occurs due to a ground-fault at the right side (the maintenance section 4B side) of the boundary 7A at the center of the joint portion 2A (the boundary area 8A), it can accurately detect that the temperature peak position P is located at the right side of the surplus portion 51 of the optical fiber 5.

Figures 10, 11, 12:
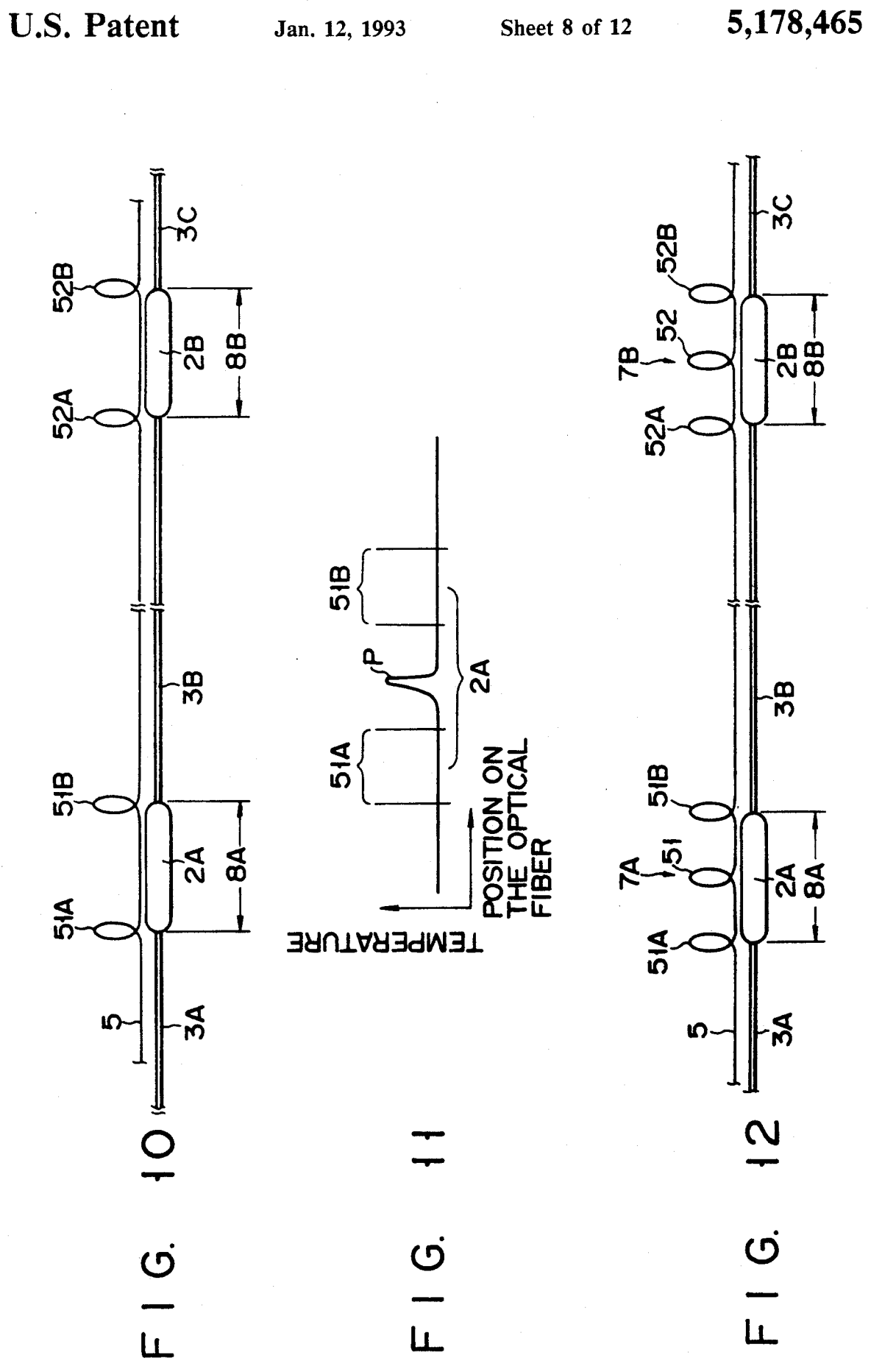

FIG. 10 shows other embodiment of the fourth aspect of the present invention.

In the embodiment in FIG. 10, loop-shaped marginal portions 51A, 51B; 52A, 52B are formed at the positions corresponding to both ends of the joint portions 2A and 2B at the optical fiber 5.

In this embodiment, if temperature peak occurs in the vicinity of the joint portions 2A and 2B, it can accurately determine at which of inside the joint portions 2A, 2B and outside the joint portions 2A, 2B the temperature peak position belongs to. FIG. 11 shows the relationship between the longitudinal position of the optical fiber when the temperature peak position P occur in the joint portion 2A and the detecting temperature.

FIG. 12 shows an embodiment of combination of the embodiments in FIGS. 1 and 10. In this case, loop-shaped surplus portions 51, 51A, 51B; 52, 52A, 52B are formed at three positions of both ends of the joint portions 2A and 2B (boundary areas 8A and 8B) and the center (boundaries 7A and 7B) at the optical fiber 5. According to this embodiment, it can easily and accurately determine at which of right and left sides of the boundaries 7A and 7B the temperature peak position belongs to according to the presence of the surplus portions 51 and 52 at the centers of the joint portions 2A and 2B (boundaries 7A and 7B), and it can also easily and accurately determine at which of inside the joint portions 2A and 2B and outside the joint portions 2A and 2B the temperature peak position belongs to according to the presence of the surplus portions 51A, 51B; 52A, 52B at both ends of the joint portions 2A and 2B at the same time.

In the embodiment shown in FIG. 7 as described above, the boundaries 7A and 7B are disposed at the centers of the joint portions 2A and 2B. However, the present invention is not limited to the particular embodiment. For example, the boundaries 7A and 7B may be disposed at the ends of the joint portions 2A and 2B. In this case, in order to accurately determine at which of the sides to the boundaries 7A and 7B the temperature peak position belongs to, it is desirable to form the surplus portion of the optical fiber at the boundaries of the ends of the joint portions 2A and 2B.

In addition, the boundaries 7A and 7B may be set at entirely individually independent position from the joint portions 2A and 2B. In this case, this embodiment is different from the embodiments according to the third and fourth aspects of the present invention.

According to the detecting optical fiber laying structure for the electric power cable line trouble occurrence location detecting system of the third aspect of the present invention, the surplus portion is formed at the longitudinal portion of the optical fiber at least at one portion in the vicinity of the boundary of the electric power cable line. Therefore, the detecting accuracy of the temperature peak position, i.e., the occurrence location of a trouble such as the ground-fault in the vicinity of the boundary is high, and hence at which of the adjacent sections the trouble occurrence is generated can be easily determined.

According to the detecting optical fiber laying structure for the electric power cable line trouble occurrence location detecting system of the fourth aspect of the present invention, the surplus portion is formed at the longitudinal portion of the optical fiber at least at one portion of the joint portions of the unit cables of the electric power cable line. Therefore, the detecting accuracy of the temperature peak position, i.e., the occurrence location of a trouble such as a ground-fault is high in the vicinity of the joint portion, and hence the trouble occurrence at the joint portion having high occurrence frequency of a trouble such as a ground-fault can be accurately detected.

Figure 13:
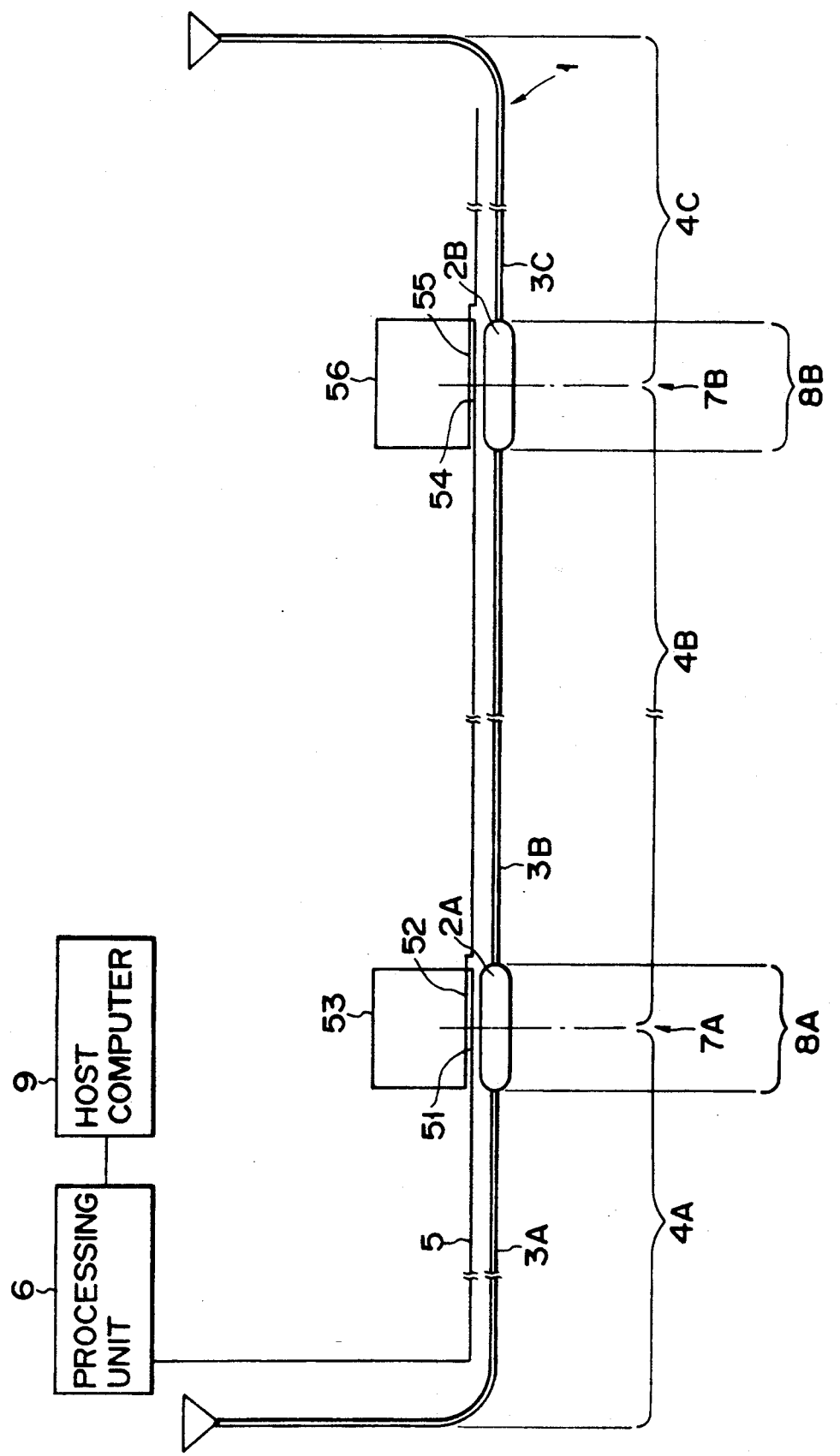
FIG. 13 is a schematic view showing an entire arrangement of other embodiment of a detecting optical fiber laying structure for an electric power cable line trouble occurrence location detecting system according to the present invention.

FIG. 13 schematically shows an entire arrangement of an embodiment according to fifth and sixth aspects of the present invention.

In FIG. 13, an electric power cable line 1 has a plurality of unit cables 3A to 3C connected in series through joint portions 2A and 2B. The electric power cable line 1 is divided into a plurality of maintenance sections 4A to 4C at the centers of the joint portions 2A and 2B as boundaries 7A and 7B. Therefore, the joint portions 2A and 2B respectively become boundary areas 8A to 8B. An optical fiber 5 is laid along the entire electric power cable line 1. The optical fiber 5 is connected to a distribution type temperature sensor processing unit 6, which is, in turn, connected to a host computer 9. Two portions 51 and 52 disposed at a predetermined interval in the longitudinal direction of the optical fiber 5 are superposed to be laid along the optical fiber 5 at the joint portion 2A (i.e., the boundary area 8A). In other words, after the optical fiber 5 is laid at the portion 51 along the joint portion 2A, a surplus portion 52 is returned in a state isolated from the joint portion 2A, and again laid at the portion 52 along the joint portion 2A. Two portions 54 and 55 disposed at a predetermined interval in the longitudinal direction of the optical fiber 5 are similarly superposed to be laid along the joint portion 2B (i.e., the boundary area 8B), and a surplus portion 56 similarly isolated from the joint portion 2B is formed between the portions 54 and 55 of the optical fiber 5.

Figure 14:
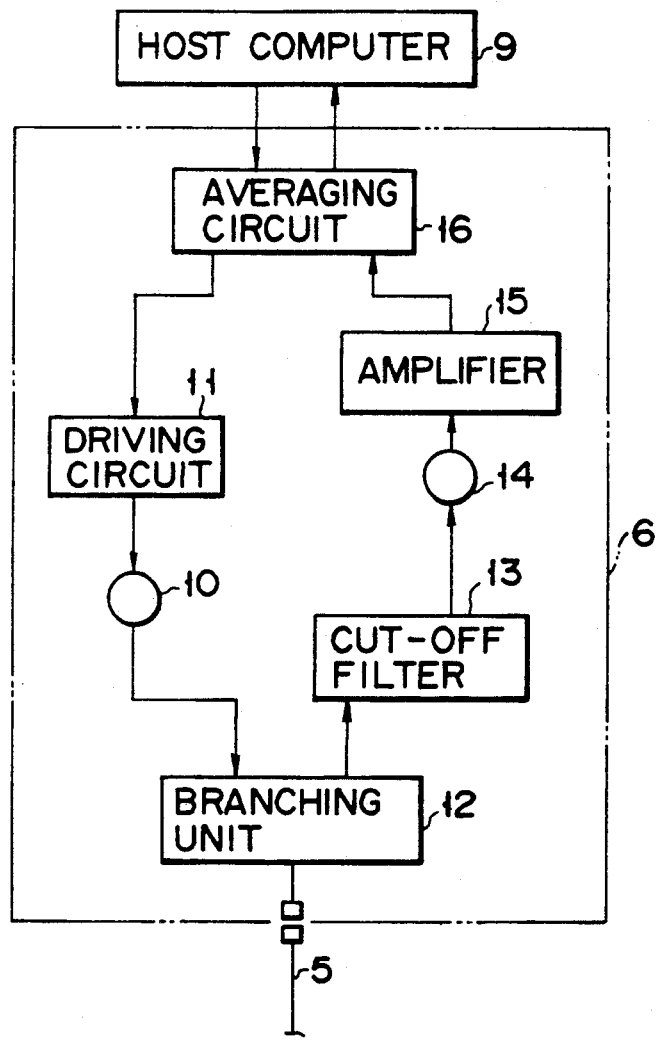
FIG. 14 is a block diagram showing an arrangement of a processing unit used for the electric power cable line trouble occurrence location detecting system of FIG. 13.
Figure 15:
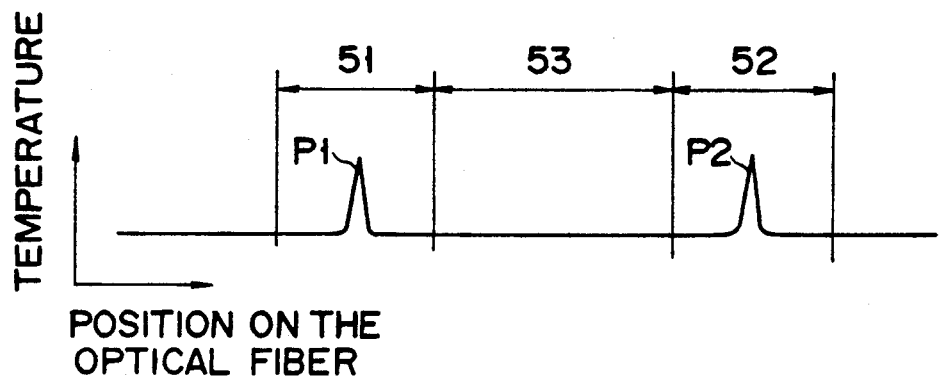
FIG. 15 is a diagram showing the relationship between the longitudinal position of the optical fiber of the arrangement of FIG. 13 and the detecting temperature.

An arrangement of distribution type temperature sensor processing unit 6 connected to the optical fiber 5 may be the same as ordinary one, and is normally formed as shown in FIG. 14. More specifically, the processing unit 6 emits a laser pulse light as an incident light to the optical fiber 5, isolates a Raman backscattering light to be returned from the optical fiber, photodetects the Raman backscattering light, amplifies and averages the same light. As shown in FIG. 14, the processing unit comprises a laser light source 10 for oscillating a laser light pulse as an incident light to the optical fiber, a driving circuit 11 for driving the laser light source 10, a branching unit 12 for separating a Raman backscattering light from reflected scattering light to be returned from the optical fiber 5, a cut-off filter 13 for cutting off the light component except the Raman light in the Raman backscattering light, a photodetector 14 for converting the Raman backscattering light to be output from the cut-off filter 13 into an electric signal, an amplifier 15 for amplifying the electric signal from the photodetector 14, and an averaging circuit 16 for improving S/N ratio of the electric signal. The output signal from the processing unit 6 (the output signal from the averaging circuit 16) is applied to the host computer 9, and a control signal from the host computer 9 is applied to the processing unit 6. The host computer 9 calculates the output signal from the processing unit 6 to obtain a temperature distribution in the longitudinal direction of the optical fiber 5 and to further obtain the temperature peak position, i.e., the occurrence location of a trouble such as a ground-fault. At this time, as described above, since the two portions 51, 52; 54, 55 having different longitudinal directions of the optical fiber are superposed to be laid along the joint portions 2A and 2B (the boundary areas 8A and 8B) as described above, the host computer 9 calculates the data obtained by the signal from the portions of the optical fiber, and can accurately obtain the temperature peak position, i.e., the occurrence location of a trouble such as a ground-fault. For example, if a temperature peak occurs at the joint portion 2A (the boundary area 8A) due to a trouble such as a ground-fault, as shown in FIG. 15, temperature peaks P1 and P2 occur at the two portions 51 and 52 of the optical fiber 5. Accordingly, when the host computer 9 stores in advance the length of the surplus portion 53 and the superposing length of the portions 51 and 52, the computer 9 can obtain the temperature peak position of the joint portion 2A.

Figure 16:
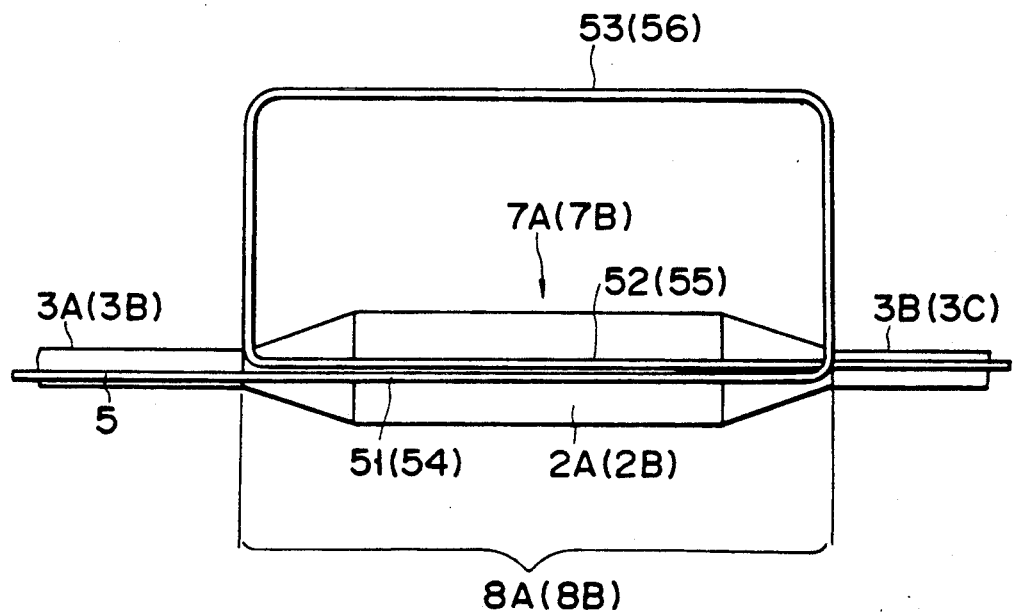
FIGS. 16 to 18 are front views showing several examples of essential portion of the detecting optical fiber laying structure shown in FIG. 13.
Figure 17:
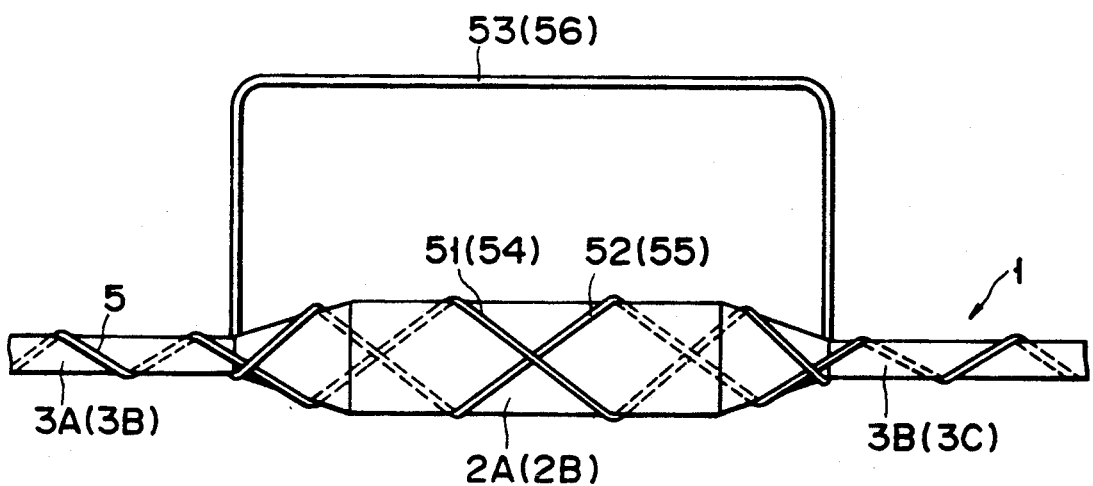
Figure 18:
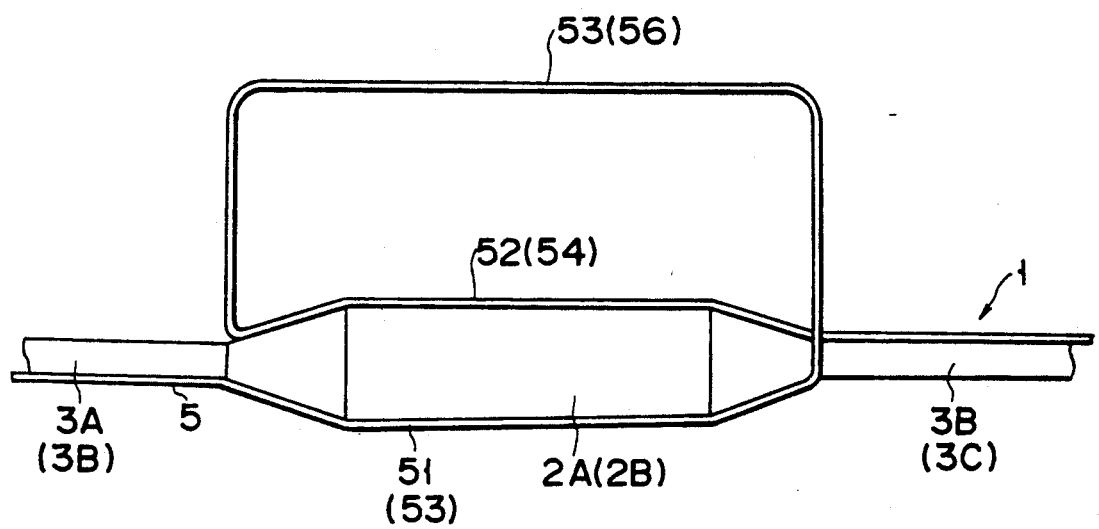

A concrete arrangement in which the optical fiber 5 is laid along the unit cables 3A to 3C and the joint portions 2A and 2B is optional. For example, as shown in FIG. 16, the optical fiber 5 may be supported by suitable supporting means (not shown) linearly along the longitudinal direction of the electric power cable line, or spirally wound on the electric power cable line as shown in FIG. 17. The superposition of the two portions of the optical fiber at the joint portions 2A and 2B to be laid along the optical fiber is not limited to the case that the optical fiber is superposed double at the same side of the joint portions 2A and 2B or arranged adjacent to each other. For example, as shown in FIG. 18, it includes that the portions of the optical fiber are arranged on the opposed surfaces of the joint portions 2A and 2B.

Figure 19:
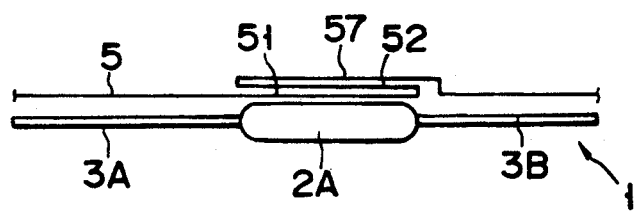
FIG. 19 is a schematic view showing the other embodiment of the detecting optical fiber laying structure of FIG. 13.

Further, in the embodiment described above, the two portions 51, 52; 54, 55 of the optical fiber 5 are superposed to be laid along the joint portions 2A and 2B (the boundary areas 8A and 8B). However, the present invention is not limited to the particular embodiment. For example, three or more portions having different longitudinal directions of the optical fiber may be superposed to be laid along the joint portions 2A and 2B (the boundary areas 8A and 8B). For example, as shown in FIG. 19, three portions 51, 52, 57 of the optical fiber 5 may be superposed to be laid along the joint portion 2A (the boundary area 8A). In the example in FIG. 19, a surplus portion is not particularly formed between the portions 51, 52 and 57 of the optical fiber 5.

Further, in the embodiment in FIG. 13 as described above, the boundaries 7A and 7B are disposed at the centers of the joint portions 2A and 2B. However, the present invention is not limited to the particular embodiment. For example, the boundaries 7A and 7B may be disposed at the ends of the joint portions 2A and 2B. In this case, the boundary areas 8A and 8B may be normally determined, similarly to the above-described embodiment, to be the same areas as the joint portions 2A and 2B. Alternatively, areas including the portions of both sides of the boundaries 7A and 7B at the ends of the joint portions 2A and 2B, i.e., areas including both the joint portions and the ends of the unit cables connected to the joint portions may be determined to be boundary areas.

In addition, the boundaries 7A and 7B may also be set at individually independent positions from the joint portions 2A and 2B. In this case, since the boundary areas 8A and 8B are disposed at the positions isolated from the joint portions 2A and 2B, the embodiment of the fifth aspect of the present invention becomes different from the embodiment of the sixth aspect of the present invention.

According to the optical fiber laying structure for the electric power cable line trouble occurrence location detecting system of the fifth aspect of the present invention, the two or more portions of the same optical fibers having different longitudinal directions are superposed to be laid along the areas in the vicinity of the boundary of the electric power cable line. Therefore, the temperature peak position, i.e., the occurrence location of a trouble such as a ground-fault is detected by the two or more portions of the optical fiber in the areas, hence the position can be accurately detected, and thus at which of the adjacent sections the trouble occurs can be easily determined.

According to the optical fiber laying structure for the electric power cable line trouble occurrence location detecting system of the sixth aspect of the present invention, the two or more portions of the same optical fiber having different longitudinal directions are superposed to be laid along the joint portions of the unit cables of the electric power cable line. Therefore, the temperature peak position, i.e., the occurrence location of a trouble such as a ground-fault is detected by the two or more portions of the optical fiber at the joint portions, and hence the trouble occurrence signal of the joint portion having high occurrence frequency of a trouble such as the ground-fault can be accurately detected.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An optical fiber laying structure for an electric power cable line trouble occurrence location detecting system for detecting a trouble occurrence location by laying an optical fiber of a temperature detector of a Raman backscattering optical fiber distribution type temperature sensor along an electric power cable line and detecting a temperature rising position of the power cable line, wherein;

said electric power cable line comprises a plurality of unit cables connected in series, with each set of two of said plurality of unit cables being connected to each other through a joint, a plurality of independent optical fibers respectively laid along said plurality of unit cables, and for each said set a portion of the optical fiber laid along one of said two unit cables is superposed on a portion of the optical fiber laid along the other of said two unit cables at said joint.

2. An optical fiber laying structure for an electric power cable line trouble occurrence location detecting system for detecting a trouble occurrence location by laying an optical fiber of a temperature detector of a Raman backscattering optical fiber distribution type temperature sensor along an electric power cable line and detecting a temperature rising position of the power cable line, wherein;

said electric power cable line comprises a plurality of unit cables connected in series, with each set of two of said plurality of unit cables being connected to each other through a joint, and an optical fiber is laid along said electric power cable line and having a looped surplus portion on each said joint.

3. An optical fiber laying structure for an electric power cable line trouble occurrence location detecting system for detecting a trouble occurrence location by laying an optical fiber of a temperature detector of a Raman backscattering optical fiber distribution type temperature sensor along an electric power cable line and detecting a temperature rising position of the power cable line, wherein;

said electric poercalbe line comprises a plurality of unit cables connected in series, with each set of two of said plurality of unit cables being connected to each other through a joint, and an optical fiber is laid along said electric power cable line and having at least two portions thereof superimposed on each said joint.

* * * * *